United States Patent [19]

Wu

[11] Patent Number: 6,069,052
[45] Date of Patent: May 30, 2000

[54] PROCESS AND STRUCTURE FOR INCREASING CAPACITANCE OF STACK CAPACITOR

[75] Inventor: Chung-Cheng Wu, I-Lan, Taiwan

[73] Assignee: Mosel Vitelic, Inc., Taiwan

[21] Appl. No.: 08/706,652

[22] Filed: Oct. 7, 1996

[51] Int. Cl.[7] .............................................. H01L 21/8242
[52] U.S. Cl. ........................ 438/398; 438/253; 438/255; 438/396; 257/306; 257/309
[58] Field of Search ..................... 257/306, 309, 257/532; 438/255, 256, 396, 397, 398, 399, 947, 964

[56] References Cited

U.S. PATENT DOCUMENTS

| 5,108,943 | 4/1992 | Sandhu et al. | 438/254 |
| 5,124,767 | 6/1992 | Koyama | 257/309 |
| 5,302,844 | 4/1994 | Mizuno et al. | 257/306 |
| 5,759,895 | 6/1998 | Tseng | 438/255 |
| 5,773,342 | 6/1998 | Fukase | 438/255 |

OTHER PUBLICATIONS

Wolf et al., "Chemical Vapor Deposition of Amorphous and Polycrystalline Films", Silicon Processing For the VLSI Era: Process Technology—vol. 1, pp. 182–185, 1986.
Wolf et al., "Dry Etching For VLSI Fabrication", Silicon Processing For the VLSI Era: Process Technology (vol. 1), pp. 540–541, 1986.

*Primary Examiner*—Mary Wilczewski
*Assistant Examiner*—Toniae M. Thomas
*Attorney, Agent, or Firm*—Madson & Metcalf

[57] ABSTRACT

The present invention provides a process and a structure for increasing a capacitance of a stack capacitor. The process includes steps of: a) forming a contact hole on a silicon substrate having an oxide layer, b) forming a polysilicon contact plug of a first polysilicon layer in the contact hole; c) forming a second gibbous polysilicon layer on a surface of the contact plug, and d) forming a third polysilicon layer above the gibbous polysilicon layer and a portion of the oxide layer to form the stack capacitor, wherein the gibbous polysilicon layer increases the capacitance of the stack capacitor.

25 Claims, 5 Drawing Sheets

PROCESS AND STRUCTURE FOR INCREASING CAPACITANCE OF STACK CAPACITOR

FIELD OF THE INVENTION

The present invention relates to a process and a structure for increasing a capacitance of a stack capacitor, especially to a process and a structure for increasing a capacitance of a stack capacitor of a dynamic random access memory (DRAM).

BACKGROUND OF THE INVENTION

A conventional structure for forming a stack capacitor in a 16 MB DRAM is a rugged polysilicon layer having a thickness of about 850 Å. Usually, the rugged polysilicon is formed on an upper surface of the other polysilicon layer having contact holes, and the wall of the contact holes, by a low pressure chemical vapor deposition (LPCVD). The stack capacitor will be constructed on the surface of the rugged polysilicon layer.

To reduce costs, the radius of a wafer is reduced and the number of integrated circuits on a wafer is increased in a semiconductor manufacture process. Unfortunately, when the wire size in a semiconductor manufacture process is reduced from 0.45 $\mu$m to 0.38 $\mu$m or less, a serious problem for the conventional technique of forming the stack capacitor on the DRAM will occur. That is, to maintain the capacitance of the stack capacitor structure, the thickness of the rugged polysilicon layer must be increased to enlarge the surface area of the stack capacitor structure. However, the added rugged polysilicon will fill up the contact hole and therefore reduce the overall surface of the rugged polysilicon layer instead of increasing it. In other words, the capacitance of the stack capacitor is insufficient in a 0.38 $\mu$m or less wire size semiconductor manufacture process on which the conventional technique of forming the rugged polysilicon layer is applied.

For the above reason, it is desirable to invent a process and a structure for a 0.38 $\mu$m or less wire size semiconductor manufacture process to maintain the capacitance of the stack capacitor of a DRAM. It is then attempted by the applicant to design such a process and such a structure.

SUMMARY OF THE INVENTION

An object of the present invention is to provide a semiconductor manufacture process which can increase the capacitance of a stack capacitor by enlarging the surface of the polysilicon layer.

The other object of the present invention is to provide a semiconductor structure for increasing the capacitance of a stack capacitor by enlarging the surface of the polysilicon layer.

The present invention provides a process for increasing a capacitance of a stack capacitor including steps of: a) forming a contact hole on a silicon substrate having an oxide layer; b) forming a polysilicon contact plug of a first polysilicon layer in the contact hole; c) forming a second polysilicon layer in a gibbous shape on a surface of the contact plug; and d) forming a third polysilicon layer above the gibbous polysilicon layer and a portion of the oxide layer to form the stack capacitor, wherein the capacitance of the stack capacitor is increased by the gibbous polysilicon layer.

In accordance with one aspect of the present invention, the oxide layer is preferably a silicon dioxide ($SiO_2$) layer. The oxide layer is preferably formed by a chemical vapor deposition (CVD). Especially, it is preferably formed by a low pressure chemical vapor deposition (LPCVD).

In accordance with another aspect of the present invention, the step a) preferably includes steps of: a1) forming a photoresistant layer above the oxide layer; a2) defining a contact hole pattern on the photoresistant layer; a3) removing a portion of the photoresistant layer according to the contact hole pattern to expose a portion of the oxide layer, and etching the portion of the oxide layer to form the contact hole; and a4) removing a remaining portion of the photoresistant layer.

In accordance with another aspect of the present invention, the oxide layer is preferably etched by a dry etching. More particularly, the dry etching is preferably a sputtering etching, a plasma etching, or a reactive ion etching.

In accordance with another aspect of the present invention, the first polysilicon layer and the third polysilicon layer are preferably formed by an LPCVD.

In accordance with another aspect of the present invention, the first polysilicon layer is preferably firstly formed in the contact hole and above the oxide layer, and is then preferably removed except a portion in the contact hole to form the contact plug.

In accordance with another aspect of the present invention, the second polysilicon is preferably formed by a selective growth method of polysilicon selectively growing a polysilicon only on a polysilicon layer.

The second polysilicon is preferably selectively grown at a temperature ranged from about 800° C. to 1000° C. and under a pressure of about 100 Pa, and preferably has a thickness having a range from about 500 Å to 5000 Å.

In accordance with another aspect of the present invention, the third polysilicon layer is preferably a rugged polysilicon layer.

In accordance with another aspect of the present invention, the third polysilicon layer preferably has a thickness having a range from about 300 Å to about 1000 Å.

In accordance with another aspect of the present invention, the third polysilicon layer is preferably formed at a temperature from about 500° C. to about 600° C.

In accordance with another aspect of the present invention, the process preferably further includes steps of: e) defining a stack capacitor area pattern on the third polysilicon layer; and f) etching a portion of the third polysilicon layer for obtaining the stack capacitor area.

In accordance with another aspect of the present invention, the stack capacitor area pattern is preferably formed by a photolithography.

In accordance with another aspect of the present invention, another process for increasing a capacitance of a stack capacitor includes steps of: a) forming a contact hole on a silicon substrate having an oxide layer; b) forming a polysilicon contact plug of a first polysilicon layer in the contact hole; c) forming a second polysilicon layer in a gibbous shape on a surface of the contact plug; d) forming a third polysilicon layer above the gibbous polysilicon layer and a portion of the oxide layer; and e) forming a fourth polysilicon layer above the third polysilicon to form the stack capacitor, wherein the capacitance of the stack capacitor is increased by the gibbous polysilicon layer.

In accordance with another aspect of the present invention, the first polysilicon layer, the third polysilicon layer and the fourth polysilicon layer are preferably formed by an LPCVD.

In accordance with another aspect of the present invention, the second polysilicon is preferably formed by a selective growth method of polysilicon selectively growing a polysilicon only on a polysilicon layer.

The second polysilicon is preferably selectively grown at a temperature having a range from about 800° C. to 1000° C. and under a pressure of about 100 Pa, and preferably has a thickness having a range from about 500 Å to 5000 Å.

In accordance with another aspect of the present invention, the third polysilicon layer is preferably a normal polysilicon layer.

In accordance with another aspect of the present invention, the fourth polysilicon layer is preferably a rugged polysilicon layer.

In accordance with another aspect of the present invention, the fourth polysilicon layer preferably has a thickness having a range from about 300 Å to about 1000 Å.

In accordance with another aspect of the present invention, the fourth polysilicon layer is preferably formed at a temperature from about 500° C. to about 600° C.

In accordance with another aspect of the present invention, the process further includes steps of: f) defining a stack capacitor area pattern on the fourth polysilicon layer; and g) respectively etching portions of the fourth polysilicon layer and the third polysilicon layer for obtaining the stack capacitor area.

The present invention further provides a structure for increasing a capacitance of a stack capacitor on a silicon substrate including: the silicon substrate, an oxide layer formed on the silicon substrate and provided with a contact hole, a first polysilicon layer forming a contact plug in the contact hole and having a gibbous surface on a surface of the contact plug, and a second polysilicon layer formed above the gibbous surface of the contact plug to form the stack capacitor, wherein the second polysilicon layer on the gibbous surface of the contact plug increases the capacitance of the stack capacitor.

In accordance with another aspect of the present invention, the oxide layer is preferably a silicon dioxide layer.

In accordance with another aspect of the present invention, the gibbous surface of the contact plug preferably has a thickness having a range from about 500 Å to 5000 Å.

In accordance with another aspect of the present invention, the second polysilicon layer is preferably a rugged polysilicon layer.

In accordance with another aspect of the present invention, the second polysilicon layer preferably has a thickness having a range from about 300 Å to about 1000 Å.

The present invention may best be understood through the following description with reference to the accompanying drawings, in which:

DETAILED DESCRIPTION OF THE PREFERRED EMBODIMENTS

Figure 1:
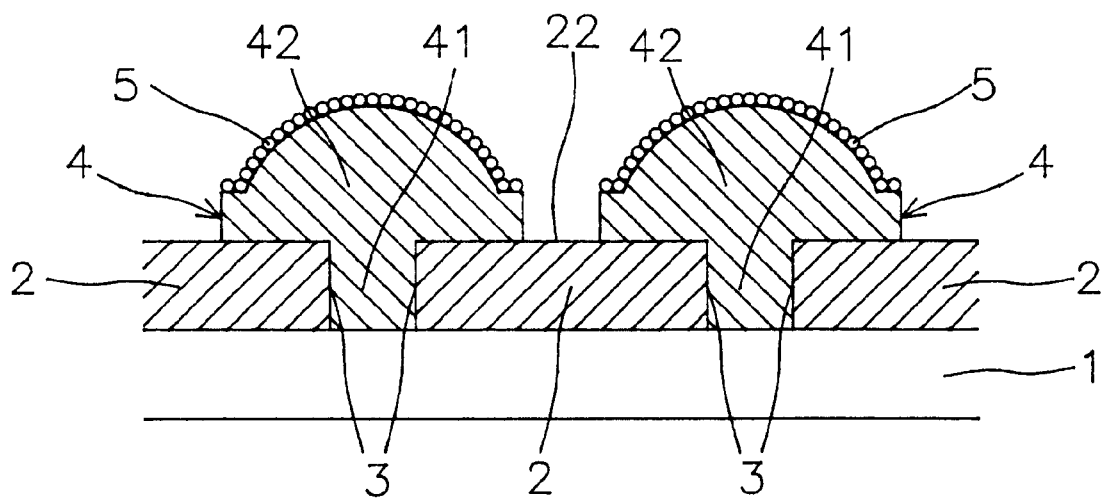
FIG. 1 is a schematic illustration of a preferred embodiment of a structure according to the present invention.

Referring to FIG. 1, which indicates a semiconductor structure including a silicon substrate 1, an oxide layer 2, a contact hole 3, a first polysilicon region 4 and a second polysilicon region 5. The oxide layer 2 is a silicon dioxide layer, and the second polysilicon region 5 is a rugged polysilicon layer.

The silicon dioxide layer 2 is formed over the silicon substrate 1, and the contact holes 3 are provided within the oxide layer 2. Furthermore, the first polysilicon layer 4 is distributed in the contact hole 3 and a portion of the oxide layer 2 around the contact hole 3. The first polysilicon layer 4 in the contact hole 3 constructs the contact plug 41, and the top surface of the polysilicon layer 4 has a gibbous shape. The polysilicon layer on the gibbous surface has a thickness of about 500 Å to 5000 Å. Furthermore, the rugged polysilicon layer 5 having a thickness of about 300 Å to 1000 Å is distributed over the gibbous polysilicon layer 42. The gibbous surfaced polysilicon region 42 enlarges the surface area of the rugged polysilicon layer 5, thus increases the capacitance of the stack capacitor.

FIGS. 2(a)–2(e) illustrate a preferred embodiment of a process for forming the stack capacitor according to the present invention.

Figure 2A:
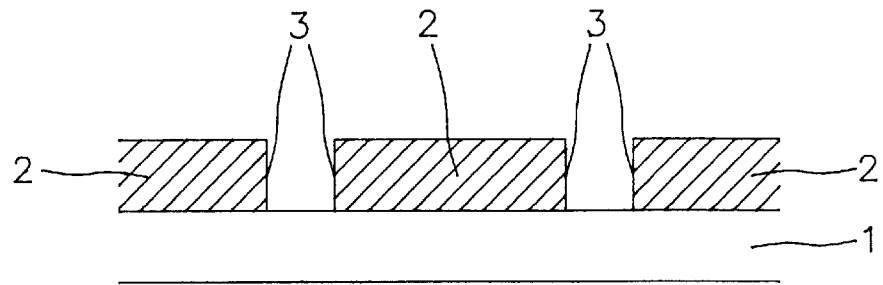
FIGS. 2(a)–2(e) schematically illustrate a preferred embodiment of a process according to the present invention.

FIG. 2(a) includes steps of:
 forming a silicon dioxide layer 2 over the silicon substrate 1 by a chemical vapor deposition (CVD), or, a low pressure chemical vapor deposition (LPCVD);
 forming a photoresist layer (not shown) over the silicon dioxide layer 2;
 defining a contact hole pattern on the photoresist layer;
 removing the photoresist layer according to the contact hole pattern, and etching the exposed silicon dioxide layer to form the contact hole 3 by a dry etching method such as a sputtering etching, a plasma etching or a reactive ion etching; and
 removing the remaining photoresist layer.

Figure 2B:
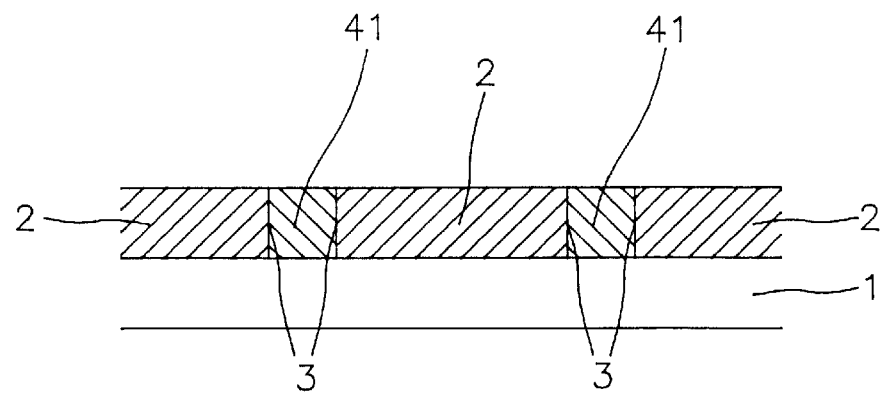

FIG. 2(b) includes steps of:
 forming a first polysilicon layer in the contact hole 3 and over the silicon dioxide layer 2 by an LPCVD; and
 removing the first polysilicon layer on the silicon dioxide layer 2 and maintaining the one in the contact hole 3 to form the contact plug 41.

Figure 2C:
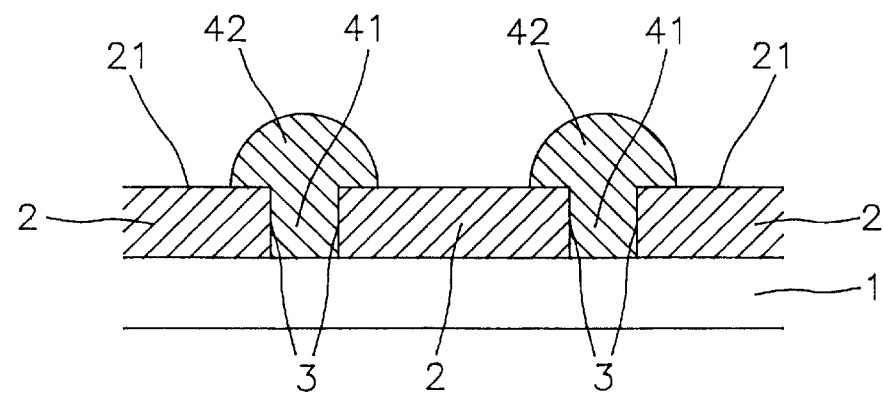

FIG. 2(c) includes a step of:
 forming a second polysilicon layer 42 having a thickness of about 500 Å to 5000 Å over the top surface of the polysilicon contact plug 41. The second polysilicon layer has a gibbous surface, and is formed by a selective growth of polysilicon at a temperature ranged from about 800° C. to 1000° C. and under a pressure of about 100 Pa. The selective growth of the polysilicon ensures that the second polysilicon layer will not grow on the region 21 of the silicon dioxide 2.

Figure 2D:
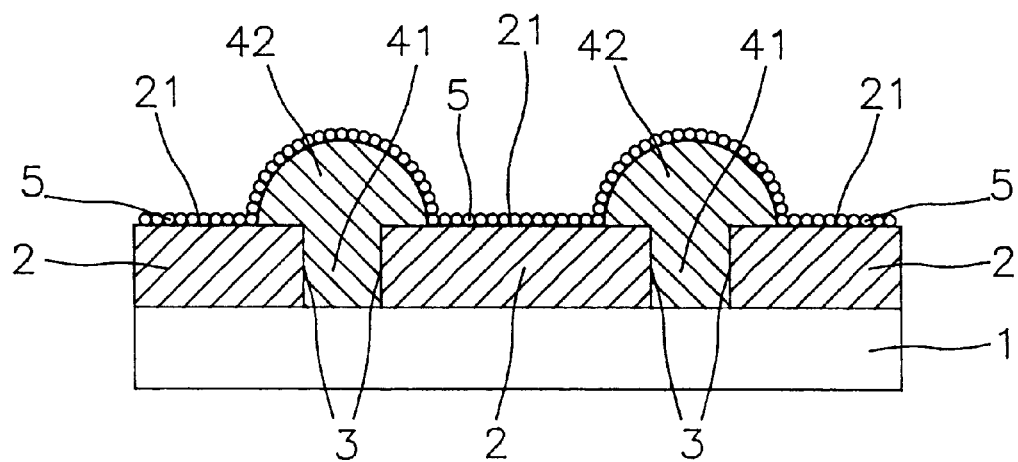

FIG. 2(d) includes a step of:
 forming a rugged polysilicon layer 5 over the second polysilicon layer 42 and the region 21 of the oxide layer 2 by an LPCVD at a temperature ranged from about 500° C. to 600° C.

Figure 2E:
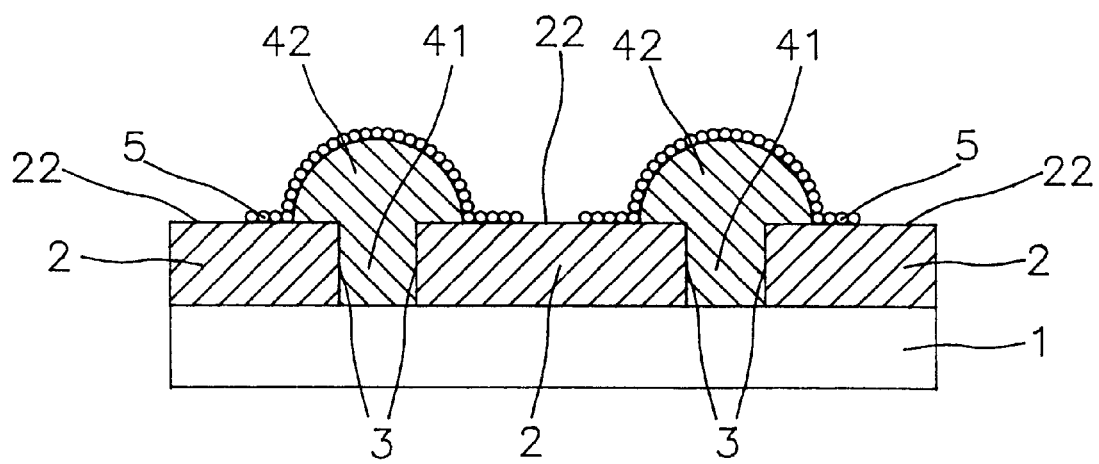

FIG. 2(e) includes steps of:
 defining a stack-capacitor pattern on the rugged polysilicon layer 5 by a photolithography technique; and
 etching the rugged polysilicon layer 5 to expose the region 22 of the silicon dioxide 2. The gibbous surface of the polysilicon layer 42 will increase the surface area of the rugged polysilicon layer 5 and thus raise the capacitance of the stack capacitor.

FIGS. 3(a)–3(f) illustrate another preferred embodiment of a process for forming the stack capacitor according to the present invention.

Figure 3A:
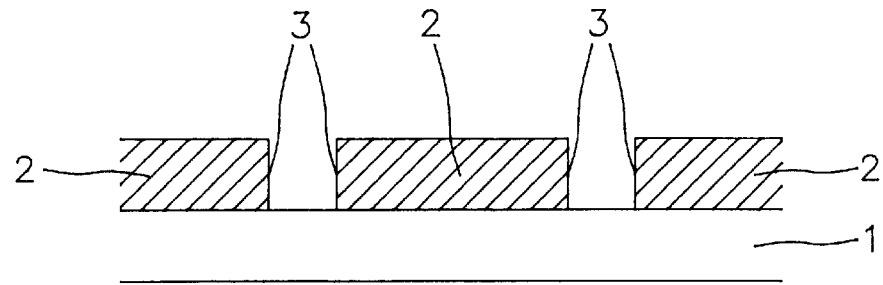
FIGS. 3(a)–3(f) schematically illustrate another preferred embodiment of a process according to the present invention.

FIG. 3(a) includes steps of:
forming an silicon dioxide layer 2 over the silicon substrate 1 by a chemical vapor deposition (CVD), or a low pressure chemical vapor deposition (LPCVD);
forming a photoresist layer (not shown) over the silicon dioxide layer 2;
defining a contact hole 3 pattern on the photoresist layer;
removing the photoresist layer which is under the contact hole pattern, and etching the exposed silicon dioxide layer to form the contact hole 3 by a dry etching method such as a sputtering etching, a plasma etching or a reactive ion etching; and
removing the remaining photoresist layer.

Figure 3B:
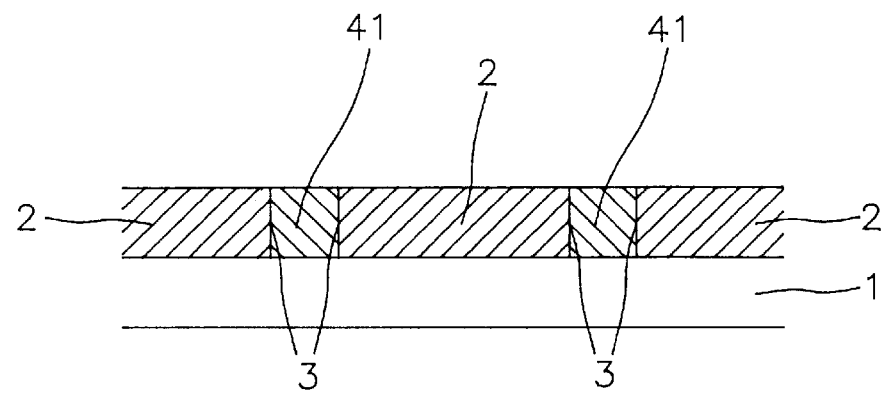

FIG. 3(b) includes steps of:
forming a first polysilicon layer in the contact hole 3 and over the silicon dioxide layer 2 by an LPCVD; and
removing the first polysilicon layer on the silicon dioxide layer 2 and maintaining the one in the contact hole 3 to form the contact plug 41.

Figure 3C:
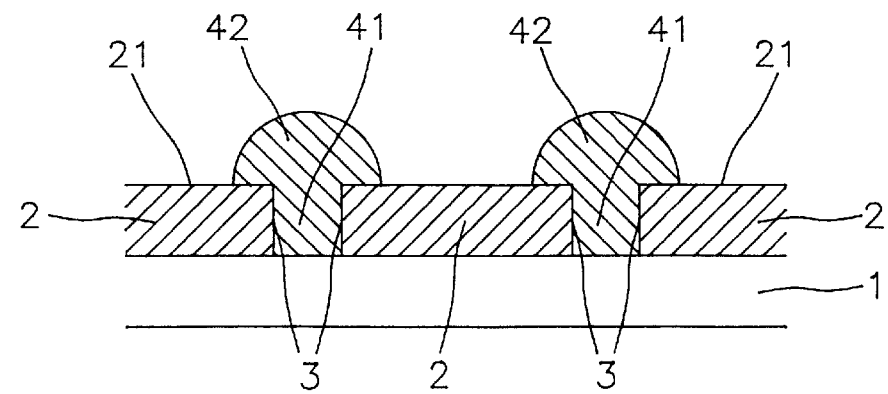

FIG. 3(c) includes a step of:
forming a second polysilicon layer having a thickness of about 500 Å to 5000 Å over the top surface of the polysilicon contact plug 41. The second polysilicon layer has a gibbous surface, and is formed by a selective growth of polysilicon at a temperature ranged from about 800° C. to 1000° C. and under a pressure of about 100 Pa. The selective growth of the polysilicon ensures that the second polysilicon layer 42 will not grow on the region 21 of the silicon dioxide 2.

Figure 3D:
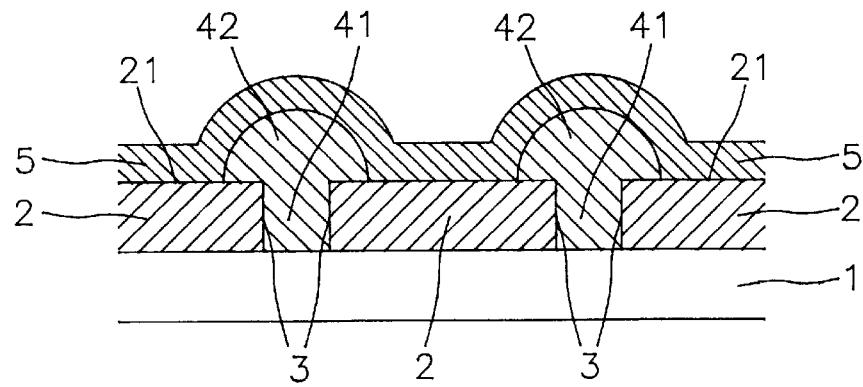

FIG. 3(d) includes a step of:
forming a third polysilicon layer 5 over the second polysilicon layer 42 and the region 21 of the oxide layer 2 by an LPCVD.

Figure 3E:
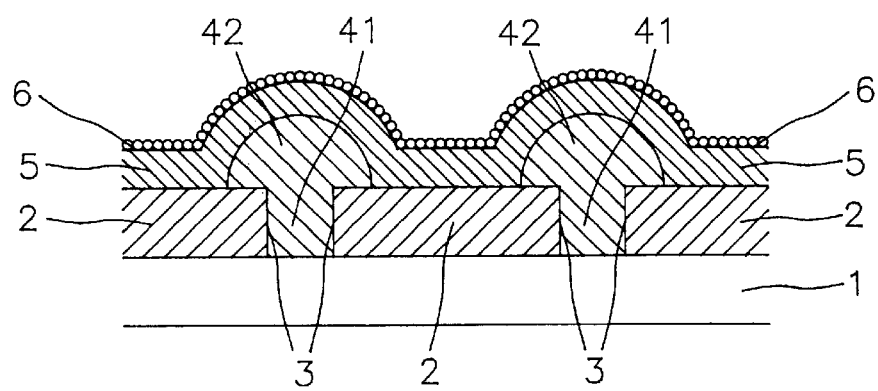

FIG. 3(e) includes a step of:
forming a rugged polysilicon layer 6 having a thickness of about 300 Å to 1000 Å over the third polysilicon layer 5 by an LPCVD at a temperature having a range from about 500° C. to 600° C.

Figure 3F:
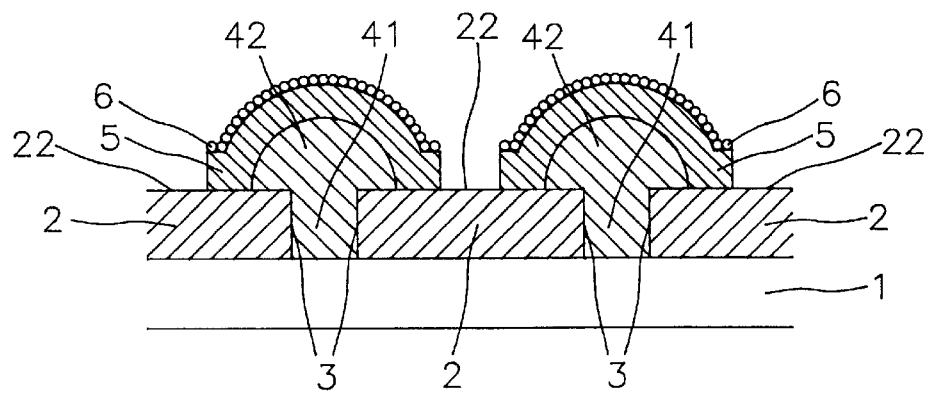

FIG. 3(f) includes steps of:
defining a stack-capacitor pattern on the rugged polysilicon layer by a photolithography technique; and
etching the rugged polysilicon layer 6 and the third polysilicon layer 5 to expose the region 22 of the silicon dioxide 2. The gibbous surface of the polysilicon layer 42 will increase the surface area of the rugged polysilicon layer 5 and thus raise the capacitance of the stack capacitor.

It is obvious from the abovementioned preferred embodiments of the present invention that, a polysilicon layer having a gibbous surface can increase the surface area of a rugged polysilicon layer of a semiconductor device, and therefore is able to maintain the capacitance of the stack capacitor constructed by the rugged polysilicon layer easily in a 0.38 µm or less wire size process. The capacitance of the stack capacitor can be adjusted according to the variation of the thickness of the gibbous polysilicon layer. That is to say, the capacitance of the stack capacitor can be adjusted to a required value in various applications.

Furthermore, because of the round-shaped edge of the gibbous polysilicon, and because of the thinner polysilicon layer between any two gibbous polysilicons, the probability of generating voids will be decreased when proceeding the planarization by deposing a dielectric layer, and a better effect of the planarization will be obtained.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for increasing a capacitance of a stack capacitor comprising steps of:
    a) forming a contact hole on a silicon substrate having an oxide layer formed thereon;
    b) depositing a first polysilicon layer in said contact hole to form a polysilicon contact plug in said contact hole;
    c) selectively growing a second polysilicon layer on the first polysilicon layer, wherein said second polysilicon layer has a gibbous surface; and
    d) forming a third polysilicon layer above said gibbous surface and a portion of said oxide layer to form said stack capacitor, wherein said gibbous surface increases said capacitance of said stack capacitor, and wherein said third polysilicon layer is a rugged polysilicon layer.

2. A process according to claim 1, wherein said oxide layer is a silicon dioxide ($SiO_2$) layer.

3. A process according to claim 2, wherein said oxide layer is formed by a chemical vapor deposition (CVD).

4. A process according to claim 3, wherein said oxide layer is formed by a low pressure chemical vapor deposition (LPCVD).

5. A process according to claim 1, wherein said step a) includes steps of:
    a1) forming a photoresist layer above said oxide layer;
    a2) defining a contact hole pattern on said photoresist layer;
    a3) removing a portion of said photoresist layer according to said contact hole pattern to expose a portion of said oxide layer, and etching said portion of said oxide layer to form said contact hole; and
    a4) removing a remaining portion of said photoresist layer.

6. A process according to claim 5, wherein in said step a3) said oxide layer is etched by a dry etching.

7. A process according to claim 6, wherein said dry etching is a sputtering etching.

8. A process according to claim 6, wherein said dry etching is a plasma etching.

9. A process according to claim 6, wherein said dry etching is a reactive ion etching.

10. A process according to claim 1, wherein said first polysilicon layer is first formed in said contact hole above said oxide layer, and is then removed except a portion in said contact hole to form said contact plug.

11. A process according to claim 1, wherein said first polysilicon layer and said third polysilicon layer are formed by an LPCVD, and said second polysilicon layer is selectively grown at a temperature ranging from about 800° C. to 1000° C. and under a pressure of about 100 Pa, and has a thickness having a range from about 500 Å to 5000 Å.

12. A process according to claim 1, wherein said third polysilicon layer has a thickness from about 300 Å to about 1000 Å.

13. A process according to claim 1, wherein said third polysilicon layer is formed at a temperature from about 500° C. to about 600° C.

14. A process according to claim 1, further comprising steps of:

d) defining a stack capacitor area pattern on said third polysilicon layer; and e) etching a portion of said third polysilicon layer to obtain said stack capacitor area.

15. A process according to claim 14, wherein said stack capacitor area pattern is formed by a photolithography.

16. A process for increasing a capacitance of a stack capacitor comprising steps of:

a) forming a contact hole on a silicon substrate having an oxide layer formed thereon;

b) forming a polysilicon contact plug in said contact hole, wherein said contact plug has a gibbous surface on a top portion of said contact plug;

c) forming a third polysilicon layer above said gibbous surface and a portion of said oxide layer; and d) forming a fourth polysilicon layer above said third polysilicon layer to form said stack capacitor;

wherein said gibbous surface increases said capacitance of said stack capacitor.

17. A process according to claim 16, wherein said step b) includes the steps of:

b1) forming a first polysilicon layer in said contact hole;

b2) forming said contact plug from said first polysilicon layer; and b3) forming a second polysilicon layer in a gibbous shape on said top portion of said contact plug.

18. A process according to claim 17, wherein said second polysilicon layer is formed by a selective growth method of polysilicon selectively growing on a polysilicon layer.

19. A process according to claim 18, wherein said first polysilicon layer, said third polysilicon layer and said fourth polysilicon layer are formed by an LPCVD, and said second polysilicon layer is selectively grown at a temperature ranging from about 800° C. to 1000° C. and under a pressure of about 100 Pa, and has a thickness having a range from about 500 Å to 5000 Å.

20. A process according to claim 16, wherein said third polysilicon layer is a polysilicon layer.

21. A process according to claim 16, wherein said fourth polysilicon layer is a rugged polysilicon layer.

22. A process according to claim 16, wherein said fourth polysilicon layer has a thickness from about 300 Å to about 1000 Å.

23. A process according to claim 16, wherein said fourth polysilicon layer is formed at a temperature from about 500° C. to about 600° C.

24. A process according to claim 16, further comprising steps of:

e) defining a stack capacitor area pattern on said fourth polysilicon layer; and f) respectively etching portions of said fourth polysilicon layer and said third polysilicon layer for obtaining said stack capacity or area.

25. A process for increasing a capacitance of a stack capacitor comprising the steps of:

a) forming a contact hole on a silicon substrate having an oxide layer formed thereon;

b) forming a polysilicon contact plug in said contact hole, wherein said contact plug has a gibbous surface on a top portion of said contact plug;

c) forming a rugged polysilicon layer above said gibbous surface and a portion of said oxide layer to form said stack capacitor, wherein said gibbous surface and said rugged polysilicon layer increases said capacitance of said capacitor.

* * * * *